(12) United States Patent
Kuibira et al.

(10) Patent No.: US 6,403,510 B1
(45) Date of Patent: Jun. 11, 2002

(54) ALUMINUM NITRIDE SINTERED BODY AND MANUFACTURING METHOD THEREOF

(75) Inventors: Akira Kuibira; Hirohiko Nakata; Kenjiro Higaki; Kazutaka Sasaki; Takashi Ishii, all of Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 16 days.

(21) Appl. No.: 09/641,056

(22) Filed: Aug. 17, 2000

(30) Foreign Application Priority Data

Aug. 25, 1999 (JP) ............................................. 11-237709

(51) Int. Cl.⁷ ............................................... C04B 35/00
(52) U.S. Cl. ..................................... 501/98.5; 501/98.4
(58) Field of Search ............................... 501/98.4, 98.5, 501/96.1, 152

(56) References Cited

U.S. PATENT DOCUMENTS

| | | | |
|---|---|---|---|
| 5,077,245 A | | 12/1991 | Miyahara |
| 5,508,240 A | * | 4/1996 | Komatsu et al. ........... 501/98.2 |
| 5,516,734 A | * | 5/1996 | Kuszyk et al. .............. 266/266 |
| 5,541,145 A | * | 7/1996 | Harris et al. ................. 428/698 |
| 5,744,410 A | * | 4/1998 | Komatsu et al. ........... 501/97.2 |
| 5,744,411 A | * | 4/1998 | Zhao et al. .............. 156/89.27 |
| 5,760,532 A | * | 6/1998 | Makoto et al. ............. 313/130 |
| 5,763,344 A | * | 6/1998 | Komatsu .................... 264/681 |
| 5,773,377 A | * | 6/1998 | Harris et al. ................. 428/698 |
| 6,001,760 A | * | 12/1999 | Katsuda et al. ............. 279/128 |
| 6,017,485 A | * | 1/2000 | Enck et al. .................. 264/614 |
| 6,174,614 B1 | * | 1/2001 | Yushio et al. ............... 428/698 |
| 6,271,136 B1 | * | 8/2001 | Shue et al. .................. 438/685 |

FOREIGN PATENT DOCUMENTS

| | | |
|---|---|---|
| JP | 49-111909 | 10/1974 |
| JP | 61-209959 | 9/1986 |
| JP | 62-153173 | 7/1987 |
| JP | 5-7349 | 1/1993 |
| JP | 6-49613 | 6/1994 |
| JP | 7-17457 | 3/1995 |
| JP | 7-121830 | 12/1995 |
| JP | 09175867 | 7/1997 |
| JP | 2742600 | 4/1998 |
| JP | 63-190761 | 8/1998 |

* cited by examiner

Primary Examiner—Tom Dunn
Assistant Examiner—Colleen P. Cooke
(74) Attorney, Agent, or Firm—W. F. Fasse; W. G. Fasse

(57) ABSTRACT

An aluminum nitride sintered body with high heat conductivity and high strength as well as a method of inexpensively manufacturing such an aluminum nitride sintered body at a low temperature are provided. The aluminum nitride sintered body is manufactured by adding a compound of at least one type of rare earth element (R) selected from La, Ce, Pr, Sm; and Eu, Y compound, Ca compound, and Al compound to an AlN powder and sintering the resulting mixture at a temperature of 1550° C. to 1750° C. The content of oxygen forming $Al_2O_3$ existing in an aluminate with rare earth element (R), Y and Ca and oxygen forming independently existing $Al_2O_3$ is calculated as 0.01 to 5.0% by weight, heat conductivity is 166 to 200 W/mK, and bending strength is at least 300 MPa.

11 Claims, No Drawings

ALUMINUM NITRIDE SINTERED BODY AND MANUFACTURING METHOD THEREOF

BACKGROUND OF THE INVENTION

1. Field of the Invention

The present invention relates to aluminum nitride sintered bodies and manufacturing methods thereof and, more specifically to an aluminum nitride sintered body with high heat conductivity and high strength and a method of inexpensively manufacturing the aluminum nitride sintered body at a low temperature.

2. Description of the Background Art

Recently, non-toxic aluminum nitride (AlN) with high heat conductivity and high insulative property is taking the place of alumina with low heat conductivity or toxic BeO, which has conventionally been used for a substrate of various kinds of electronic parts.

However, aluminum nitride is a material which cannot be readily sintered, so that a sintering temperature must be at least 1800° C. Accordingly, a sintering furnace or jig must be made of an expensive material to ensure sufficient heat resistance. In addition, such a sintering furnace or jig must be frequently replaced due to rapid wastage, resulting in a high running cost including a power consumption cost. This increases the prices of aluminum nitride sintered bodies, whereby the diffusion of the aluminum nitride sintered bodies is restricted.

Further, since it is difficult to sinter aluminum nitride independently, a sintering method has conventionally been employed which utilizes a liquid phase obtained by adding and heating a sintering agent of a rare earth element compound or an alkaline earth metal compound. Another contemplated approach is to add both of the rare earth element compound and alkaline earth metal compound to enable sintering at a low temperature.

For example, Japanese Patent Laying-Open No. 62-153173, Japanese Patent Publication No. 6-49613, Japanese Patent Laying-Open No. 9-175867 or the like discloses a method of manufacturing an aluminum nitride sintered body including an aluminum nitride, rare earth aluminum oxide and alkaline earth metal aluminum oxide by adding a rare earth element compound and alkaline earth metal compound to aluminum nitride. Further, Japanese Patent Laying-Open No. 63-190761, Japanese Patent Publication No. 7-17457 or the like discloses an aluminum nitride sintered body mainly including an aluminum oxide and also including as a sintering agent an yttrium compound of rare earth element and a calcium compound of alkaline rare earth metal element.

Such a combination of the rare earth compound and alkaline rare earth metal compound as the sintering agent enables an aluminum nitride to be sintered at a temperature lower than the conventional case. This enables the manufacture of the aluminum nitride sintered body with high density and conductivity. Recently, the aluminum nitride is finding its usage in a wider range.

However, there still remains a problem. For example, $Y_2O_3$+CaO is used as a typical sintering agent of the rare earth compound and alkaline earth metal compound. As described in Japanese Patent Laying-Open No. 63-190761, Japanese Patent Publication No. 7-17457 or the like, a sufficiently low melting point is not achieved even in the case of the typical sintering agent and, more specifically, only a relative density of 70% to 80% is achieved at a sintering temperature of 1600° C. Densification is achieved at 1650° C., but a condition is extremely unstable. In fact, a sintered body obtained at 1650° C. is not uniform in color. Thus, to increase the yield by stable sintering, a sintering temperature of at least 1700° C. is required. Moreover, the maximum heat conductivity of the aluminum nitride sintered body thus obtained is as low as 110 W/mk.

Japanese Patent No. 2742600 discloses a method of manufacturing an aluminum nitride sintered body with high heat conductivity by using an Yb metal compound and a Ca metal compound. However, the maximum heat conductivity of the sintered body obtained at the sintering temperature of 1600° C. is as low as 130 W/mK. Further, Japanese Patent Laying-Open No. 61-209959 discloses a method of decreasing a sintering temperature by adding a fluoride of rate earth elements. This method suffers from a problem that the method involves high material cost and the inner wall of an apparatus is subjected to corrosion due to a fluorine oxide produced by firing.

Further, Japanese Patent Publication No. 5-7349 discloses that an aluminum nitride sintered body which is highly densified and provided with high conductivity can be obtained by adding a nitride of 3A group elements according to the periodic low table, and at least one of oxide and fluoride of 3A group elements, and a nitride, oxide and fluoride of 2A group element as a sintering agent to an aluminum nitride. However, the nitride of 3A group elements is unstable, absorbing a vapor steam in the atmosphere and readily turning to an oxide, during which cracking or the like is caused by a change in volume. Thus, due care must be exercised in handling to eliminate moisture and the like.

On the other hand, Japanese Patent Publication No. 7-121830 discloses that an aluminum nitride sintered body with high conductivity of at least 200 W/mK is obtained by sintering for at least four hours at 1550° C. to 2050°πC. in a reducing ambient including a nitrogen gas and carbonic gas. When the component phases of the obtained sintered body is observed by using X-ray diffraction and an electron microscope, only AlN crystal grains are found, but no other phase is observed. As described in the embodiment of the publication, a grain boundary phase is actually reduced and removed by sintering for as long as 96 hours at a temperature as high as 1900° C. in a reduction ambient including a carbonic gas.

However, the AlN grain in the aluminum nitride sintered body which has been sintered for a long period of time at a high temperature tends to be large in size. Accordingly, although high heat conductivity is achieved by removing a grain boundary phase with low heat conductivity, cracking tends to be caused throughout the sintered body. Since the grain boundary phase is removed which connects the AlN grains, the strength of the AlN sintered body is significantly reduced. Moreover, sintering for a long period of time at a high temperature significantly increases cost.

SUMMARY OF THE INVENTION

In view of the above described conventional problems, an object of the present invention is to provide an aluminum nitride sintered body with high heat conductivity and high strength as well as a method of inexpensively manufacturing such an aluminum nitride sintered body at a low temperature.

To achieve the above mentioned object, an aluminum nitride sintered body provided by the present invention mainly includes an aluminum nitride. The aluminum nitride sintered body also includes a compound of at least one type of rare earth element (R) selected from a group of lanthanum (La), cerium (Ce), praseodymium (Pr), samarium (Sm) and europium (Eu), a calcium compound, and an aluminum compound other than an aluminum nitride. The total content of oxygen forming $Al_2O_3$ existing in an aluminate including each of the above mentioned rare earth element (R), and yttrium, calcium, and aluminum compounds and oxygen forming independently existing $Al_2O_3$ is calculated as 0.01 to 5.0% by weight, heat conductivity is 166 to 200 W/mK, and bending strength is at least 300 MPa.

The aluminum nitride sintered body of the above mentioned present invention preferably includes at least one type of rare earth element (R) selected from a group of lanthanum (La), cerium (Ce), praseodymium (Pr), samarium (Sm) and europium (Eu), where the content of the rare earth element (R) is calculated as 0.05 to 10% by weight in oxide $R_2O_3$ form. The aluminum nitride sintered body preferably includes yttrium, where the content of yttrium is calculated as 0.05 to 10% by weight in oxide $Y_2O_3$ form. The aluminum nitride sintered body preferably includes calcium, where the content of calcium is calculated as 0.05 to 5% by weight in oxide CaO form. Further, the strength of the aluminum nitride sintered body of the present invention can be increased without causing a considerable reduction in heat conductivity by adding a silicon compound, where the content of the silicon compound is calculated as 0.01 to 1.0% by weight in $SiO_2$ form.

Further, a method of manufacturing an aluminum nitride sintered body of the present invention is characterized in that an oxide powder of at least one type of rare earth element (R) selected from a group of lanthanum (La), cerium (Ce), praseodymium (Pr), samarium (Sm) and europium (Eu) or a compound which turns to the oxide of the above mentioned rare earth element in a heating process, an yttrium oxide powder or a compound which turns to an yttrium oxide in a heating process, a calcium oxide powder or a compound which turns to a calcium oxide in a heating process, and an aluminum oxide powder or a compound which turns to an aluminum oxide are added and mixed together. The obtained mixture is formed, and the compact body is sintered at a temperature of 1550° C. to 1750° C.

In the method of manufacturing the aluminum nitride sintered body, preferably, the content of the oxide powder of the rare earth element (R) or the compound which turns to the oxide of the rare earth element in the heating process is calculated as 0.05 to 10% by weight in oxide $R_2O_3$ form, the content of the yttrium oxide powder or the compound which turns to the yttrium oxide in the heating process is calculated as 0.05 to 10% by weight in oxide $Y_2O_3$ form, the content of calcium oxide powder or the compound which turns to the calcium oxide in the heating process is calculated as 0.05 to 5% by weight in oxide CaO form, and the content of the aluminum oxide powder or the compound which turns to the aluminum oxide in the heating process is calculated as 0.01 to 5% by weight in oxide $Al_2O_3$ form.

In the method of manufacturing the aluminum nitride sintered body, preferably, the oxide powder and compound added to the aluminum nitride powder is left in the sintered body, the content left is calculated as at least 80% by weight in oxide form of the total added amount of oxides. To that end, the compact body is sintered in an ambient not including carbon, or sintered for a period of time not exceeding 10 hours in an ambient including carbon. It is noted that the ambient including carbon (also referred to as a carbon ambient) means an ambient including carbon in a sintering ambient such as a non-oxidation ambient supplied with hydrocarbon and/or CO or $CO_2$ gas when a carbonic material is used for a heater of a sintering furnace or heat insulator. All the other ambients are not including carbon (also referred to as a non-carbon ambient).

The present inventors have found the effectiveness of a method of fixing an aluminum oxide in a grain boundary phase by utilizing high oxygen trapping abilities of lanthanum (La), cerium (Ce), praseodymium (Pr), samarium (Sm) and europium (Eu) of the rare earth elements in order to increase the heat conductivity and strength of the aluminum nitride sintered body. It has been also found that these rare earth elements allows the aluminum oxide to be fixed in the grain boundary phase, so that the sintering property of the aluminum oxide is enhanced by intensively adding the aluminum oxide, and that sintering is enabled at an extremely low temperature as compared with the conventional case.

More specifically, the present invention employs as a sintering agent a compound of at least one type of rare earth element (R) selected from a group of lanthanum (La), cerium (Ce), praseodymium (Pr), samarium (Sm) and europium (Eu), and an yttrium (Y) compound, a calcium (Ca) compound, and aluminum (Al) compound. An oxide, a carbonic acid compound, nitric acid compound, oxalic acid compound or the like may be employed as the above mentioned compounds. More specifically, for the compound of e.g., samarium (Sm) of the above mentioned rare earth elements (R), $Sm_2O_3$, $Sm(C_2O_4)_3 \cdot 10H_2O$, $Sm(SO_4)_3 \cdot 8H_2O$ or the like may be employed. For the yttrium compound, $Y_2O_3$, $Y_2(CO_3)_3 \cdot 3H_2O$, $Y(NO_3)_3 \cdot 6H_2O$ or the like may be employed. For the calcium compound, CaO, $CaCO_3$ or the like may be employed. For the aluminum compound, $Al_2O_3$ or the like may be employed.

The combination of the above mentioned sintering agents enables stable sintering of the aluminum nitride at the low temperature of 1550 to 1750° C. As a result, an aluminum nitride sintered body with high heat conductivity and high strength can be obtained. Although the reason is not clear, the explanation based on technical consideration will be given in the following.

Comparing a group of an oxide of rare earth element (R) selected from lanthanum (La), cerium (Ce), praseodymium (Pr), samarium (Sm) and europium (Eu) (hereinafter simply referred to as an R oxide)+Y oxide+Ca oxide with a group including only the above mentioned R oxide+Ca oxide, the densification of the sintered body can be achieved to some extent by using the latter, but the former is superior in ability of uniformly sintering with extreme densification. In addition, the system of R oxide+Y oxide still reacts and reduces viscosity of the liquid phase allowing uniform reaction. Accordingly, the R oxide is considered the most suited to the Y oxide.

Further, the yttrium oxide reacts with the aluminum oxide included in an AlN material or the added aluminum compound to produce YAG ($3Y_2O_3 \cdot 5Al_2O_3$), YAL ($Y_2O_3 \cdot Al_2O_3$), and YAM ($2Y_2O_3 \cdot Al_2O_3$). Then, ratios of $Al_2O_3$ to $Y_2O_3$ for 1 mole are respectively 5/3, 1/1, and 1/2. On the other hand, the compound of the rare earth element (R) selected from La, Ce, Pr, Sm and Eu, yttrium compound and calcium compound produce an oxide in the heating process, which react with each other to produce a double oxide. In addition, each oxide reacts with the aluminum oxide existing in the surface of AlN grains or the added aluminum compound at a high temperature exceeding 1000° C. to produce an aluminate.

More specifically, La, Ce, Pr, Sm, and Eu of the above mentioned rare earth elements (R) react with an aluminum oxide to produce $R_2O_3 \cdot Al_2O_3$, and/or $R_2O_3 \cdot 11Al_2O_3$. When the amount of $Al_2O_3$ in the grain boundary phase is small, it reacts with 1-mole $Al_2O_3$ to produce $R_2O_3 \cdot Al_2O_3$ and, if the amount of $Al_2O_3$ is large, it produces $R_2O_3 \cdot 11Al_2O_3$ to fix 11-mole $Al_2O_3$. 1-mole or 11-mole $Al_2O_3$ can be fixed per 1-mole of the above mentioned rare earth element (R). Thus, rare earth element (R) is highly adjustable to the amount of $Al_2O_3$ in the grain boundary phase, fixing (trapping) $Al_2O_3$ in the grain boundary phase which reduces heat conductivity by causing phonon dispersion by solid solution in AlN. Thus, it is extremely effective in increasing heat conductivity of the AlN sintered body.

On the other hand, an oxide of the rare earth element other than La, Ce, Pr, Sm, and Eu produces, $2R'_2O_3 \cdot Al_2O_3$, $R'_2O_3 \cdot Al_2O_3$, $3R'_2O_3 \cdot 5Al_2O_3$ or the like, if it is represented by R'. More specifically, only 0.5, 1 or 1.7-mole $Al_2O_3$ is fixed for 1-mole rare earth element (R'). The ability of trapping $Al_2O_3$ in accordance with the amount of $Al_2O_3$ in the grain boundary phase is not high as the oxide of the above mentioned rare earth element (R).

In view of the above, rare earth element at) of La, Ce, Pr, Sm, and Eu fixes $Al_2O_3$, that may cause reduction in heat conductivity, in the grain boundary phase, thereby preventing solid solution of $Al_2O_3$ into the AlN grains. Accordingly, even if a significant amount of sintering agent such as $Al_2O_3$ or the like is added, the problem associated with the solid solution of the aluminum nitride sintered bodies into the AlN crystal grains to prevent phonon conduction as well as a distortion of the AlN crystal lattice due to a thermal stress caused by the difference in thermal coefficient of expansion of $Al_2O_3$ and AlN can be minimized. Thus, the AlN sintered body with high heat conductivity can be obtained. Among rare earth elements (R) of La, Ce, Pr, Sm, and Eu, particularly, Sm is extremely effective. This is because Sm is superior to La, Ce, Pr, and Eu not only in the above mentioned fixing ratio of $Al_2O_3$ but also in an ability of fixing and holding $Al_2O_3$ in the grain boundary phase.

In the present invention, the compound of at least one type of rare earth element (R) selected from La, Ce, Pr, and Eu reacts with the aluminum oxide in the AlN powder and the added aluminum compound along with Y and Ca compounds to produce an aluminate with a low melting point. The compounds may also react with each other to produce a liquid phase and growth and sintering of the AlN grains proceed through the liquid phase, so that sintering at the low temperature of 1550° C. to 1750° C. is enabled. To that end, preferably, the content of the added compound of the rare earth element (R) is calculated as 0.05 to 10% by weight in oxygen $R_2O_3$ form, the content of the Y compound is calculated as 0.05 to 10% by weight in oxide $Y_2O_3$ form, and the content of the Ca compound is calculated as 0.05 to 5% by weight in oxide CaO form.

However, if the amount of the aluminum oxide in the AlN powder and the added aluminum compound is insufficient, the compound of the above mentioned rare earth element (R), Y compound, and Ca compound remain in the non-reacted state, whereby the liquid phase cannot be produced at the low temperature of at most 1750° C. In this case, the added compounds no longer serve as sintering agent but function as foreign matters to prevent sintering, so that the strength of the sintered body is decreased. Then, in the present invention, the aluminum oxide powder or the aluminum compound which turns to an aluminum oxide in the heating process is controllably added according to the content of the aluminum oxide in the AlN to promote sintering and increase the density and strength of the sintered body. In addition, the added aluminum compound is fixed in the grain boundary phase because of a trapping effect of rare earth element (R), so that a sintered body with high heat conductivity is ensured. Although the content of the aluminum oxide powder or aluminum compound may differ according to the amount of the aluminum oxide in the AlN powder, generally, it is preferably calculated as 0.01 to 5% by weight in oxide $Al_2O_3$ form.

Preferably, a ratio a/b of a total weight amount a of the compound of rare earth element (R) selected from La, Ce, Pr, Sm, Eu and the Y compound calculated as % by weight in oxide form to a weight amount b of the Ca compound calculated as % by weight in oxide form is greater than 9 and not exceeding 40. When ratio a/b falls below 9, the ratio of the Ca oxide produced by removing binder from the compact body increases, so that a hygroscopic property of the compact body increases. As a result, the compact body absorbs moisture in handling or in storage to partially increase in volume, so that it becomes prone to cracking. A possible measure is to store the compact body in a vacuum desiccator or store it in a space with nitrogen, or remove binder from the compact body in a dry space and quickly sinter it, so as to reduce the occurrence of cracking. However, this measure is not practical in terms of productivity and cost involved. On the other hand, if ratio a/b exceeds 40, the Ca compound becomes extremely ineffective. Thus, it becomes difficult to produce a liquid phase and to obtain a sintered body with densification at the low temperature.

It is noted that Japanese Patent Laying-Open No. 49-111909 discloses that AlN is crystallized in columnar crystal to be provided with high strength by adding silicon, $SiO_2$, and silicate to AlN. However, a plate-like or a needle-like AMN crystal thereby generated is of an AlN poly-type (15R), which is in fact low in heat conductivity. As a result, the heat conductivity of the obtained AMN sintered body is significantly reduced to less than 100 W/mK.

On the other hand, with the promoter type including rare earth element (R) selected from La, Ce, Pr, Sm, Bu, Y, and Ca, by adding the silicon oxide powder or the compound which turns to the silicon oxide in the heating process, where the content added is calculated as 0.01 to 1.0% by weight in oxide $SiO_2$ form, the above mentioned plate-like or needle-like poly-type is not obtained, so that high heat conductivity is achieved while ensuring high strength. The reason is not clear, but the possible reason is that the trapping ability of rare earth element (R) of La, Ce, Pr, Sm, and Eu is high, and the trapping ability of not only oxygen but also Si is high, so that Si is occluded into the AlN grain to prevent phonon dispersion. In addition, the added Si reacts with each oxide of rare earth element (R), Y, and Ca forming the grain boundary phase to reduce the viscosity of the liquid phase and to increase wettability and density of the AlN and the grain boundary phase, thereby contributing to an increase in the strength of the sintered body and a reduction in variation thereof (an increase in Weibull coefficient).

In addition, if the grain boundary phase is eliminated by heating in a carbon ambient for a long period of time, although the heat conductivity of the sintered body increases, the strength is reduced. To prevent the reduction in strength, a moderate amount of the grain boundary phase is left to prevent excessive granulation of the AlN crystals. To that end, the compound of rare earth element (R), Y compound, Ca compound or the like, which are added in the present invention, must be left by a content calculated as at least 80% in oxide form in the AlN sintered body.

More specifically, sintering is performed in a non-carbon ambient not including carbon, or if sintering is performed in a carbon ambient including carbon, sintering must be performed within 10 hours. It is noted that, if sintering is performed in a furnace using a heater formed of carbon or heat insulator, carbon ambient is produced other than to add a CO or hydrocarbon based gas to the ambient. To avoid this situation, for example, molybdenum or tungsten is used for a heater. In addition, a furnace must be provided with an insulator formed of a metal such as molybdenum or tungsten or a heat-resisting brick such as alumina.

The aluminum nitride sintered body of the present invention thus manufactured mainly includes AlN. It also includes a compound of at least one type of rare earth element (L) selected from a group of La, Ce, Pr, Sm, and Eu, Y compound, Ca compound, and AlN compound other than AlN. The content of oxygen forming $Al_2O_3$ in an aluminate including (R), Y, Ca and Al and oxygen forming independently existing $Al_2$, $O_3$ is in total 0.01 to 5.0% by weight. The content of oxygen in the aluminate is calculated as follows. For example, in the case of $Y_2O_3$—$Sm_2O_3$—CaO system, assuming a total amount of oxygen in the sintered body is a, Y element amount is b, Sm element amount is c, Ca element amount is d, atomic weights of Y, Sm and Ca are respectively 88.9059, 150.4 and 40.08, the amount of oxygen in the aluminate $X=a-15.9994\{(3/2)(b/88.9059)+(3/2)(c/150.4)+(d/40.08)\}$. It is noted that total amount of oxygen a in sintered body is measured by oxygen and nitrogen analysis, whereas Y, Sm and Ca element amounts b, c and d are measured by ICP emission spectrochemical analysis.

Preferably, the aluminum nitride sintered body includes the above mentioned rare earth element (R), the content of which is calculated as 0.05 to 10% by weight in oxide $R_2O_3$ form. It also includes Y, the content of which is calculated as 0.05 to 10% by weight in oxide $Y_2O_3$ form. It also includes Ca, the content of which is calculated as 0.05 to 5% by weight in oxide CaO form. If the content of rare earth element (R) is calculated as less than 0.05% by weight in $R_2O_3$ form, the content of Y less than 0.05% by weight in $Y_2O_3$ form, or the content of Ca less than 0.05% by weight in CaO form, densification is not achieved and a desired AlN sintered body is not produced. In addition, if rare earth element (R), Y or Ca is included, of which content is calculated as 10, 10 or 5% by weight in $R_2O_3$, $Y_2O_3$, or Ca form, respectively, (R), Y, or Ca is left in the grain boundary phase as a low conductivity material, so that the heat conductivity of the AlN sintered body tends to be reduced.

Further, a total weight amount A of the compound of the rare earth element (R) and the yttrium compound, respectively calculated in $R_2O_3$ and $Y_2O_3$ forms preferably satisfies $9<A/B\leq40$ with respect to a weight amount B of the calcium compound calculated in oxide CaO form. A silicon compound may farther be included, the content of which is preferably calculated as 0.01 to 1.0% by weight in oxide $SiO_2$ form.

The aluminum nitride sintered body according to the present invention is provided with high heat conductivity and high strength. More specifically, the heat conductivity is 166 to 200 W/mK and bending strength is at least 300 MPa.

According to the present invention, by employing lanthanum (La), cerium (Ce), praseodymium (Pr), samarium (Sm) and europium (Bu) of the rare earth elements, the ability of trapping the aluminum oxide in the grain boundary phase is enhanced. If it is used along with the yttrium, calcium and aluminum compounds, stable sintering is enabled at the temperature as low as 1550° C. to 1750° C., so that the aluminum nitride sintered body with high heat conductivity and high strength is provided.

In addition, since stable sintering is enabled at the low temperature of 1550 to 1750° C., a depreciation cost of a sintering setter or insulator as well as a running cost such as power consumption can be reduced, so that the total manufacturing cost of the aluminum nitride sintered body is reduced. Accordingly, the aluminum nitride sintered body with high heat conductivity and high strength can be provided at a low cost, thereby considerably contributing to diffusion of aluminum nitride used as a heat emitting substrate for an electronic part.

DESCRIPTION OF THE PREFERRED EMBODIMENTS

Example 1

As shown in the following Table 1, oxides of La, Ce, Pr, Sm, Eu and powders of $Y_2O_3$, $CaCO_3$, $SiO_2$, $Al_2O_3$ are added as sintering agents to an AlN material powder with average grain diameter of 0.6 μm and oxygen content of 1.2% by weight. This is mixed with an organic binder in an organic solvent by a resin ball mill to obtain a slurry. The slurry is granulated by a spray-dry method and pressed for shaping. Then, the slurry is degreased at 800° C. in a nitrogen ambient. Thereafter, each compact body is sintered under a sintering condition shown in the following Table 1, in a nitrogen ambient (non-carbon ambient) or in a carbon ambient (carbonic ambient). It is noted that the content of $CaCO_3$ is calculated in CaO form, and a/b is a ratio of a total weight amount a of a compound powder of rare earth element (R) and an $Y_2O_3$ powder being calculated in oxide form, with respect to a weight amount b of a $CaCO_3$ powder calculated in oxide form.

TABLE 1

| sample | rare earth element oxide | (wt %) | $Y_2O_3$ (wt %) | $CaCO_3$ (wt %) | $Al_2O_3$ (wt %) | $SiO_2$ (wt %) | a/b | sintering condition (° C. × hr) | ambient |
|---|---|---|---|---|---|---|---|---|---|
| 1 | $Sm_2O_3$ | 2.7 | 3.2 | 0.6 | 0.6 | 0 | 9.8 | 170 × 4 | nitrogen |
| 2 | $Sm_2O_3$ | 2.7 | 3.2 | 0.6 | 0.6 | 0 | 9.8 | 170 × 4 | carbon |
| 3 | $Sm_2O_3$ | 2.7 | 3.2 | 0.6 | 0.6 | 0.6 | 9.8 | 170 × 4 | nitrogen |
| 4 | $Sm_2O_3$ | 2.7 | 3.2 | 0.6 | 0.6 | 0.8 | 9.8 | 170 × 4 | nitrogen |
| 5* | $Sm_2O_3$ | 2.7 | 3.2 | 0.6 | 0 | 0.8 | 9.8 | 170 × 4 | nitrogen |
| 6 | $Sm_2O_3$ | 1.2 | 1.7 | 0.3 | 0.5 | 0 | 9.7 | 170 × 4 | nitrogen |
| 7 | $Sm_2O_3$ | 1.2 | 1.7 | 0.3 | 0.5 | 0.5 | 9.7 | 170 × 4 | nitrogen |
| 8 | $Sm_2O_3$ | 2.7 | 3.2 | 0.6 | 0.6 | 0 | 9.8 | 165 × 4 | nitrogen |
| 9 | $Sm_2O_3$ | 2.7 | 3.2 | 0.6 | 0.6 | 0.6 | 9.8 | 165 × 4 | nitrogen |
| 10 | $Sm_2O_3$ | 2.7 | 3.2 | 0.6 | 0.6 | 0 | 9.8 | 160 × 4 | nitrogen |
| 11 | $Sm_2O_3$ | 2.7 | 3.2 | 0.6 | 0.6 | 0.6 | 9.8 | 160 × 4 | nitrogen |

TABLE 1-continued

| sample | rare earth element oxide | Y$_2$O$_3$ (wt %) | CaCO$_3$ (wt %) | Al$_2$O$_3$ (wt %) | SiO$_2$ (wt %) | a/b | sintering condition (° C. × hr) | ambient |
|---|---|---|---|---|---|---|---|---|
| 12 | Sm$_2$O$_3$ | 2.7 | 3.2 | 0.6 | 0.2 | 0 | 9.8 | 160 × 4 | nitrogen |
| 13 | Sm$_2$O$_3$ | 2.7 | 3.2 | 0.6 | 0.2 | 0.6 | 9.8 | 160 × 4 | nitrogen |
| 14 | Sm$_2$O$_3$ | 2.7 | 3.2 | 0.6 | 0.6 | 0 | 9.8 | 158 × 4 | nitrogen |
| 15 | Sm$_2$O$_3$ | 2.7 | 3.2 | 0.6 | 0.6 | 0.6 | 9.8 | 158 × 4 | nitrogen |
| 16 | La$_2$O$_3$ | 2.7 | 3.2 | 0.6 | 0.6 | 0 | 9.8 | 160 × 4 | nitrogen |
| 17 | Ce$_2$O$_3$ | 2.7 | 3.2 | 0.6 | 0.6 | 0 | 9.8 | 160 × 4 | nitrogen |
| 18 | Pr$_2$O$_3$ | 2.7 | 3.2 | 0.6 | 0.6 | 0 | 9.8 | 160 × 4 | nitrogen |
| 19 | Eu$_2$O$_3$ | 2.7 | 3.2 | 0.6 | 0.6 | 0 | 9.8 | 160 × 4 | nitrogen |
| 20* | Ho$_2$O$_3$ | 2.7 | 3.2 | 0.6 | 0.6 | 0 | 9.8 | 160 × 4 | nitrogen |
| 21* | Dy$_2$O$_3$ | 2.7 | 3.2 | 0.6 | 0.6 | 0 | 9.8 | 160 × 4 | nitrogen |
| 22* | Nd$_2$O$_3$ | 2.7 | 3.2 | 0.6 | 0.6 | 0 | 9.8 | 160 × 4 | nitrogen |
| 23* | None | 0 | 5.7 | 0.6 | 0.6 | 0 | 9.5 | 170 × 4 | nitrogen |
| 24* | None | 0 | 5.7 | 0.6 | 0.6 | 0.6 | 9.5 | 170 × 4 | nitrogen |
| 25* | None | 0 | 5.7 | 0.6 | 0.6 | 0 | 9.5 | 160 × 4 | nitrogen |
| 26* | None | 0 | 5.7 | 0.6 | 0.6 | 0.6 | 9.5 | 160 × 4 | nitrogen |
| 27* | Sm$_2$O$_3$ | 2.7 | 0 | 0.6 | 0.7 | 0.6 | 4.5 | 160 × 4 | nitrogen |
| 28* | Sm$_2$O$_3$ | 5.7 | 0 | 0.6 | 0.7 | 0.6 | 9.5 | 160 × 4 | nitrogen |
| 29* | Sm$_2$O$_3$ Nd$_2$O$_3$ | 2.7 3.0 | 0 | 0.6 | 0.7 | 0.6 | 9.5 | 160 × 5 | nitrogen |
| 30 | Sm$_2$O$_3$ | 2.7 | 3.0 | 2.1 | 0.6 | 0 | 2.7 | 170 × 4 | nitrogen |
| 31 | Sm$_2$O$_3$ | 2.7 | 3.0 | 1.2 | 0.6 | 0 | 4.8 | 170 × 4 | nitrogen |
| 32 | Sm$_2$O$_3$ | 2.7 | 3.0 | 0.3 | 0.6 | 0 | 19.0 | 170 × 4 | nitrogen |
| 33* | Sm$_2$O$_3$ | 2.7 | 3.0 | 0.6 | 0.6 | 0 | 9.5 | 180 × 4 | nitrogen |
| 34* | Sm$_2$O$_3$ | 2.7 | 3.0 | 0.6 | 0.7 | 0 | 9.5 | 190 × 80 | carbon |
| 35* | Yb$_2$O$_3$ Nd$_2$O$_3$ | 2.5 3.0 | 0 | 0.6 | 0.7 | 0 | 9.2 | 170 × 4 | nitrogen |
| 36 | Sm$_2$O$_3$ | 0.03 | 3.2 | 0.35 | 0.6 | 0 | 9.2 | 170 × 4 | nitrogen |
| 37 | Sm$_2$O$_3$ | 15.0 | 3.2 | 0.35 | 0.6 | 0 | 52.0 | 170 × 4 | nitrogen |
| 38 | Sm$_2$O$_3$ | 2.7 | 0.03 | 0.35 | 0.6 | 0 | 7.8 | 170 × 4 | nitrogen |
| 39 | Sm$_2$O$_3$ | 2.7 | 15.0 | 0.35 | 0.6 | 0 | 50.6 | 170 × 4 | nitrogen |
| 40 | Sm$_2$O$_3$ | 2.7 | 3.2 | 0.03 | 0.6 | 0 | 196.7 | 170 × 4 | nitrogen |
| 41 | Sm$_2$O$_3$ | 2.7 | 3.2 | 10.5 | 0.6 | 0 | 0.6 | 170 × 4 | nitrogen |

Note: the samples denoted by * in the above table are examples used for comparison. In addition, the content of CaCO$_3$ is calculated in oxide CaO form.

The following Table 2 shows the oxides and contents of the rare earth elements as well as the contents of Y$_2$O$_3$, CaO, SiO$_2$ for each of the obtained sintered bodies. Further, the content of the oxygen which forms Al$_2$O$_3$ existing in an aluminate of each AlN sintered body and the oxygen which forms independently existing Al$_2$O$_3$ is calculated, which is shown as an oxygen content. Further, a ratio A/B of a total content A of the oxide of the rare earth element and Y$_2$O$_3$ with respect to a content B of CaO is shown.

TABLE 2

| sample | rare earth element oxide | Y$_2$O$_3$ (wt %) | CaO (wt %) | oxygen content (wt %) | SiO$_2$ (wt %) | A/B |
|---|---|---|---|---|---|---|
| 1 | Sm$_2$O$_3$ | 2.5 | 3.0 | 0.5 | 0.24 | 0 | 10.2 |
| 2 | Sm$_2$O$_3$ | 2.0 | 2.6 | 0.2 | 0.14 | 0 | 23.0 |
| 3 | Sm$_2$O$_3$ | 2.5 | 3.0 | 0.5 | 0.24 | 0.5 | 10.2 |
| 4 | Sm$_2$O$_3$ | 2.5 | 3.0 | 0.5 | 0.24 | 0.7 | 10.2 |
| 5 | Sm$_2$O$_3$ | 2.5 | 3.0 | 0.5 | 0.005 | 0.7 | 10.2 |
| 6 | Sm$_2$O$_3$ | 1.0 | 1.5 | 0.3 | 0.19 | 0 | 9.3 |
| 7 | Sm$_2$O$_3$ | 1.0 | 1.5 | 0.3 | 0.19 | 0.4 | 9.3 |
| 8 | Sm$_2$O$_3$ | 2.5 | 3.0 | 0.5 | 0.24 | 0 | 10.2 |
| 9 | Sm$_2$O$_3$ | 2.5 | 3.0 | 0.5 | 0.28 | 0.5 | 10.2 |
| 10 | Sm$_2$O$_3$ | 2.5 | 3.0 | 0.5 | 0.24 | 0 | 10.2 |
| 11 | Sm$_2$O$_3$ | 2.5 | 3.0 | 0.5 | 0.28 | 0.5 | 10.2 |
| 12 | Sm$_2$O$_3$ | 2.5 | 3.0 | 0.5 | 0.05 | 0 | 10.2 |
| 13 | Sm$_2$O$_3$ | 2.5 | 3.0 | 0.5 | 0.09 | 0.5 | 10.2 |
| 14 | Sm$_2$O$_3$ | 2.5 | 3.0 | 0.5 | 0.24 | 0 | 10.2 |
| 15 | Sm$_2$O$_3$ | 2.5 | 3.0 | 0.5 | 0.28 | 0.5 | 10.2 |
| 16 | La$_2$O$_3$ | 2.5 | 3.0 | 0.5 | 0.24 | 0 | 10.2 |
| 17 | Ce$_2$O$_3$ | 2.5 | 3.0 | 0.5 | 0.24 | 0 | 10.2 |
| 18 | Pr$_2$O$_3$ | 2.5 | 3.0 | 0.5 | 0.24 | 0 | 10.2 |
| 19 | Eu$_2$O$_3$ | 2.5 | 3.0 | 0.5 | 0.24 | 0 | 10.2 |
| 20* | Ho$_2$O$_3$ | 2.5 | 3.0 | 0.5 | 0.24 | 0 | 10.2 |
| 21* | Dy$_2$O$_3$ | 2.5 | 3.0 | 0.5 | 0.24 | 0 | 10.2. |
| 22* | Nd$_2$O$_3$ | 2.5 | 3.0 | 0.5 | 0.24 | 0 | 10.2 |

TABLE 2-continued

| sample | rare earth element oxide | Y₂O₃ (wt %) | CaO (wt %) | oxygen content (wt %) | SiO₂ (wt %) | A/B |
|---|---|---|---|---|---|---|
| 23* | None | 0 | 5.5 | 0.5 | 0.24 | 0 | 10.2 |
| 24* | None | 0 | 5.5 | 0.5 | 0.24 | 0.5 | 10.2 |
| 25* | None | 0 | 5.5 | 0.5 | 0.24 | 0 | 10.2 |
| 26* | None | 0 | 5.5 | 0.5 | 0.24 | 0.5 | 10.2 |
| 27* | Sm₂O₃ | 2.5 | 0 | 0.5 | 0.28 | 0.5 | 4.6 |
| 28* | Sm₂O₃ | 5.0 | 0 | 0.5 | 0.28 | 0.5 | 9.3 |
| 29* | Sm₂O₃ Nd₂O₃ | 2.5 2.8 | 0 | 0.5 | 0.28 | 0.5 | 9.8 |
| 30 | Sm₂O₃ | 2.5 | 2.9 | 1.9 | 0.24 | 0 | 2.9 |
| 31 | Sm₂O₃ | 2.5 | 2.9 | 1.1 | 0.24 | 0 | 5.0 |
| 32 | Sm₂O₃ | 2.5 | 2.9 | 0.3 | 0.24 | 0 | 20.0 |
| 33* | Sm₂O₃ | 0.3 | 0.2 | 0.04 | 0.09 | 0 | 12.5 |
| 34* | Sm₂O₃ | 0.06 | 0.04 | 0.01 | 0.05 | 0 | 10.0 |
| 35* | Yb₂O₃ Nd₂O₃ | 2.3 2.8 | 0 | 0.5 | 0.28 | 0 | 9.8 |
| 36 | Sm₂O₃ | 0.03 | 3.1 | 0.32 | 0.28 | 0 | 9.9 |
| 37 | Sm₂O₃ | 11.0 | 3.1 | 0.32 | 0.28 | 0 | 44.8 |
| 38 | Sm₂O₃ | 2.7 | 0.02 | 0.32 | 0.28 | 0 | 8.6 |
| 39 | Sm₂O₃ | 2.7 | 11.0 | 0.32 | 0.28 | 0 | 43.5 |
| 40 | Sm₂O₃ | 2.7 | 3.2 | 0.03 | 0.28 | 0 | 218.5 |
| 41 | Sm₂O₃ | 2.7 | 3.2 | 9.5 | 0.28 | 0 | 0.6 |

Note: The samples denoted by * in the above table are examples for comparison.

Further, for each of the obtained AlN sintered bodies, a relative density, strength, and heat conductivity are respectively measured by Alchimedean, 3-point bending strength measuring method based on JIS-R1601, and a laser flush measurement, and the obtained results are shown in the following Table 3. It is noted that the number of compact with cracks out of ten compact bodies is shown for each sample in the remarks of the following Table 3.

TABLE 3

| sample | relative density (%) | heat conductivity (W/mK) | 3-point bending strength average (MPa) | Weibull coefficient | remarks(number of compact bodies with cracks) |
|---|---|---|---|---|---|
| 1 | 99.3 | 187 | 400 | 12 | None (0p/10p) |
| 2 | 99.6 | 196 | 340 | 11 | None (0p/10p) |
| 3 | 99.5 | 185 | 475 | 15 | None (0p/10p) |
| 4 | 99.5 | 167 | 480 | 14 | None (0p/10p) |
| 5 | 97.2 | 150 | 280 | 9 | None (0p/10p) |
| 6 | 99.1 | 183 | 370 | 10 | None (0p/10p) |
| 7 | 99.3 | 181 | 400 | 11 | None (0p/10p) |
| 8 | 99.0 | 179 | 370 | 10 | None (0p/10p) |
| 9 | 99.2 | 177 | 390 | 11 | None (0p/10p) |
| 10 | 99.2 | 178 | 360 | 11 | None (0p/10p) |
| 11 | 99.4 | 176 | 380 | 13 | None (0p/10p) |
| 12 | 97.1 | 175 | 350 | 10 | None (0p/10p) |
| 13 | 97.0 | 173 | 370 | 12 | None (0p/10p) |
| 14 | 97.6 | 172 | 300 | 10 | None (0p/10p) |
| 15 | 97.1 | 170 | 350 | 10 | None (0p/10p) |
| 16 | 98.0 | 168 | 360 | 12 | None (0p/10p) |
| 17 | 97.7 | 169 | 330 | 14 | None (0p/10p) |
| 18 | 99.6 | 166 | 340 | 11 | None (0p/10p) |
| 19 | 98.4 | 167 | 355 | 10 | None (0p/10p) |
| 20* | 95.0 | 121 | 240 | 6 | None (0p/10p) |
| 21* | 96.3 | 126 | 260 | 8 | None (0p/10p) |
| 22* | 97.9 | 131 | 270 | 9 | None (0p/10p) |
| 23* | 85.3 | 87 | 250 | 7 | None (0p/10p) |
| 24* | 88.2 | 68 | 270 | 8 | None (0p/10p) |
| 25* | 82.6 | 70 | 210 | 5 | None (0p/10p) |
| 26* | 90.0 | 60 | 260 | 8 | None (0p/10p) |
| 27* | 90.2 | 101 | 240 | 6 | 2 (2p/10p) |
| 28* | 92.3 | 113 | 260 | 8 | None (0p/10p) |
| 29* | 94.7 | 101 | 277 | 9 | None(0p/10p) |
| 30 | 95.0 | 172 | 300 | 8 | 3 (3p/10p) |
| 31 | 97.0 | 180 | 310 | 9 | 1 (1p/10p) |
| 32 | 95.0 | 167 | 300 | 7 | None (0p/10p) |
| 33* | 99.5 | 184 | 290 | 8 | None (0p/10p) |
| 34* | 99.8 | 189 | 187 | 6 | None (0p/10p) |
| 35* | 99.8 | 160 | 330 | 14 | None (0p/10p) |
| 36 | 92.4 | 167 | 310 | 10 | None (0p/10p) |

TABLE 3-continued

| sample | relative density (%) | heat conductivity (W/mK) | 3-point bending strength average (MPa) | Weibull coefficient | remarks(number of compact bodies with cracks) |
|---|---|---|---|---|---|
| 37 | 99.6 | 168 | 350 | 14 | None (0p/10p) |
| 38 | 90.2 | 166 | 330 | 11 | 1 (1p/10p) |
| 39 | 99.7 | 167 | 330 | 13 | None (0p/10p) |
| 40 | 89.4 | 169 | 310 | 10 | None (0p/10p) |
| 41 | 99.9 | 166 | 320 | 15 | 8 (8p/10p) |

Note: The samples denoted by * in the above table are examples for comparison.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An aluminum nitride sintered body mainly including an aluminum nitride and also including a compound of at least one type of rare earth element (R) selected from a group of lanthanum (La), cerium (Ce), praseodymium (Pr), samarium (Sm), europium (Eu), an yttrium compound, a calcium compound, and an aluminum compound other than an aluminum nitride, wherein a total content of oxygen forming $Al_2O_3$ existing in an aluminate including each of said rare earth element (R), yttrium, calcium and aluminum compounds and oxygen forming independently existing $Al_2O_3$ is 0.01 to 5.0% by weight, heat conductivity is 166 to 200 W/mK, and bending strength is at least 300 MPa.

2. The aluminum nitride sintered body according to claim 1, wherein a content of said rare earth element (R) is calculated as 0.05 to 10% by weight in oxide $R_2O_3$ form, a content of yttrium is calculated as 0.05 to 10% by weight in oxide $Y_2O_3$ form, and a content of calcium is calculated as 0.05 to 5% by weight in oxide CaO form.

3. The aluminum nitride sintered body according to claim 1, wherein a total weight amount A of said rare earth element (R) and yttrium compounds respectively calculated in $R_{23}$ and $Y_2O_3$ forms satisfies a relation of 9<A/B≦40, with respect to a weight amount B of said calcium compound calculated in oxide CaO form.

4. The aluminum nitride sintered body according to claim 1, further including a silicon compound, wherein a content of said silicon compound is calculated as 0.01 to 1.0% by weight in oxide $SiO_2$ form.

5. The aluminum nitride sintered body according to claim 1, wherein said rare earth element (R) is samarium (Sm).

6. A method of manufacturing an aluminum nitride sintered body according to claim 1, comprising the steps of:

adding to and mixing with an aluminum nitride powder an oxide powder of at least one type of rare earth element (R) selected from a group of lanthanum (La), cerium (Ce), praseodymium (Pr), samarium (Sm), and europium (Bu) or a compound which turns to an oxide of said rare earth element in a heating process, an yttrium oxide powder or a compound which turns to an yttrium oxide in the heating process, a calcium oxide powder or a compound which turns to a calcium oxide in the heating process, and an aluminum oxide powder or a compound which turns to an aluminum oxide in the heating process so as to prepare a mixture;

forming said mixture to obtain a compact body; and sintering said compact body at a temperature of 1550° C. to 1750° C.

7. The method of manufacturing the aluminum nitride sintered body according to claim 6, wherein a content of said oxide powder of said rare earth element (R) or said compound which turns to the oxide of said rare earth element in the heating process is calculated as 0.05 to 10% by weight in oxide $R_2O_3$ form, a content of said yttrium oxide powder or the compound which turns to the yttrium oxide in the heating process is calculated as 0.05 to 10% by weight in oxide $Y_2O_3$ form, a content of said calcium oxide powder or said compound which turns to the calcium oxide in the heating process is calculated as 0.05 to 5% by weight in oxide CaO form, and a content of said aluminum oxide powder or said compound which turns to the aluminum oxide in the heating process is calculated as 0.01 to 5% by weight in oxide $Al_2O_3$ form.

8. The method of manufacturing the aluminum nitride sintered body according to claim 6, wherein a total weight amount a of said oxide powder of said rare earth element (R) or said compound which turns to the oxide of said rare earth element in the heating process calculated in oxide $R_2O_3$ form and said yttrium oxide powder or said compound which turns to the yttrium oxide in the heating process calculated in oxide $Y_2O_3$ form satisfies a relation of 9<a/b≦40, with respect to a weight amount of said calcium oxide powder or said compound which turns to the calcium oxide in the heating process calculated in oxide CaO form.

9. The method of manufacturing the aluminum nitride sintered body according to claim 6, wherein a silicon oxide powder or a compound which turns to a silicon oxide in a heating process is further added, a content of which is calculated as 0.01 to 1.0% by weight in oxide $SiO_2$ form.

10. The method of manufacturing the aluminum nitride sintered body according to claim 6, wherein a content calculated as at least 80% by weight in each oxide form of said each oxide powder and compound added to said aluminum nitride powder is left in said sintered body.

11. The method of manufacturing the aluminum nitride sintered body according to claim 6, wherein said step of sintering said compact body includes the step of sintering said compact body in an ambient not including carbon or sintering said compact body for a period of time not exceeding 10 hours in an ambient including carbon.

* * * * *

UNITED STATES PATENT AND TRADEMARK OFFICE
CERTIFICATE OF CORRECTION

PATENT NO. : 6,403,510 B1
DATED : June 11, 2002
INVENTOR(S) : Kuibira et al.

It is certified that error appears in the above-identified patent and that said Letters Patent is hereby corrected as shown below:

Title page,
Item [75], Inventors, after "of", replace "Itami" by -- Itami-shi --.
Item [*], Notice, following "by", replace "16 days" by -- 100 days --.

Column 2,
Line 36, after "to", replace "2050°$_\Pi$C," by -- 2050°C --.

Column 4,
Line 28, after "elements", replace "(R), $Sm_2O_3$, $Sm (C_2O_4)_3.10H_2O$, $Sm(SO_4)_3.8H_2O$" by -- (R), $Sm_2O_3$, $Sm (C_2O_4)_3 \cdot 10H_2O$, $Sm(SO_4)_3 \cdot 8H_2O$ --.
Line 30, before "or", replace "$Y_2O_3$, $Y_2(CO_3)_3. 3H_2O$, $Y(NO_3)_3.6H_2O$" by -- $Y_2O_3$, $Y_2(CO_3)_3 \cdot 3H_2O$, $Y(NO_3)_3 \cdot 6H_2O$ --.
Line 55, after "YAG", replace "$(3Y_2O_3.5Al_2O_3)$," by -- $(3Y_2O_3 \cdot 5Al_2O_3)$ --;
Line 56, before "Then,", replace "$(Y_2O_3.Al_2O_3)$, and YAM $(2Y_2O_3.Al_2O_3)$" by -- $(Y_2O_3 \cdot Al_2O_3)$, and YAM $(2Y_2O_3 \cdot Al_2O_3)$ --.

Column 5,
Line 1, after "produce", replace "$R_2O_3.Al2O_3$, and/or $R_2O_3.11Al_2O_3$."; by -- $R_2O_3 \cdot Al_2O_3$, and/or $R_2O_3 \cdot 11Al_2O_3$. --;
Line 3, after "produce", replace "$R_2O_3.Al_2O_3$" by -- $R_2O_3 \cdot Al_2O_3$ --;
Line 4, after "produces", replace "$R_2O_3.11Al_2O_3$" by -- $R_2O_3 \cdot 11Al_2O_3$ --;
Line 14, after "produces,", replace "$2R'_2O_3.Al_2O_3,$" by -- $2R'_2O_3 \cdot Al_2O_3$, --;
Line 15, before "or", replace "$R'_2O_3.Al_2O_3$, $3R'_2O_3.5Al_2O_3$" by -- $R'_2O_3 \cdot Al_2O_3, 3R'_2O_3 \cdot 5Al_2O_3$ --.
Line 21, after "element", replace "at)" by -- (R) --.

Column 6,
Line 35, after "obtained", replace "AMN" by -- AIN --.

UNITED STATES PATENT AND TRADEMARK OFFICE
CERTIFICATE OF CORRECTION

PATENT NO. : 6,403,510 B1
DATED : June 11, 2002
INVENTOR(S) : Kuibira et al.

It is certified that error appears in the above-identified patent and that said Letters Patent is hereby corrected as shown below:

Columns 8 and 9,
Please replace Table 1 to read:

Table 1

| sample | rare earth element oxide | (wt%) | $Y_2O_3$ (wt%) | $CaCO_3$ (wt%) | $Al_2O_3$ (wt%) | $SiO_2$ (wt%) | a/b | sintering condition (°C × hr) | ambient |
|---|---|---|---|---|---|---|---|---|---|
| 1 | $Sm_2O_3$ | 2.7 | 3.2 | 0.6 | 0.6 | 0 | 9.8 | 1700× 4 | nitrogen |
| 2 | $Sm_2O_3$ | 2.7 | 3.2 | 0.6 | 0.6 | 0 | 9.8 | 1700× 4 | carbon |
| 3 | $Sm_2O_3$ | 2.7 | 3.2 | 0.6 | 0.6 | 0.6 | 9.8 | 1700× 4 | nitrogen |
| 4 | $Sm_2O_3$ | 2.7 | 3.2 | 0.6 | 0.6 | 0.8 | 9.8 | 1700× 4 | nitrogen |
| 5* | $Sm_2O_3$ | 2.7 | 3.2 | 0.6 | 0 | 0.8 | 9.8 | 1700× 4 | nitrogen |
| 6 | $Sm_2O_3$ | 1.2 | 1.7 | 0.3 | 0.5 | 0 | 9.7 | 1700× 4 | nitrogen |
| 7 | $Sm_2O_3$ | 1.2 | 1.7 | 0.3 | 0.5 | 0.5 | 9.7 | 1700× 4 | nitrogen |
| 8 | $Sm_2O_3$ | 2.7 | 3.2 | 0.6 | 0.6 | 0 | 9.8 | 1650× 4 | nitrogen |
| 9 | $Sm_2O_3$ | 2.7 | 3.2 | 0.6 | 0.6 | 0.6 | 9.8 | 1650× 4 | nitrogen |
| 10 | $Sm_2O_3$ | 2.7 | 3.2 | 0.6 | 0.6 | 0 | 9.8 | 1600× 4 | nitrogen |
| 11 | $Sm_2O_3$ | 2.7 | 3.2 | 0.6 | 0.6 | 0.6 | 9.8 | 1600× 4 | nitrogen |
| 12 | $Sm_2O_3$ | 2.7 | 3.2 | 0.6 | 0.2 | 0 | 9.8 | 1600× 4 | nitrogen |
| 13 | $Sm_2O_3$ | 2.7 | 3.2 | 0.6 | 0.2 | 0.6 | 9.8 | 1600× 4 | nitrogen |
| 14 | $Sm_2O_3$ | 2.7 | 3.2 | 0.6 | 0.6 | 0 | 9.8 | 1580× 4 | nitrogen |
| 15 | $Sm_2O_3$ | 2.7 | 3.2 | 0.6 | 0.6 | 0.6 | 9.8 | 1580× 4 | nitrogen |
| 16 | $La_2O_3$ | 2.7 | 3.2 | 0.6 | 0.6 | 0 | 9.8 | 1600× 4 | nitrogen |
| 17 | $Ce_2O_3$ | 2.7 | 3.2 | 0.6 | 0.6 | 0 | 9.8 | 1600× 4 | nitrogen |
| 18 | $Pr_2O_3$ | 2.7 | 3.2 | 0.6 | 0.6 | 0 | 9.8 | 1600× 4 | nitrogen |
| 19 | $Eu_2O_3$ | 2.7 | 3.2 | 0.6 | 0.6 | 0 | 9.8 | 1600× 4 | nitrogen |
| 20* | $Ho_2O_3$ | 2.7 | 3.2 | 0.6 | 0.6 | 0 | 9.8 | 1600× 4 | nitrogen |
| 21* | $Dy_2O_3$ | 2.7 | 3.2 | 0.6 | 0.6 | 0 | 9.8 | 1600× 4 | nitrogen |
| 22* | $Nd_2O_3$ | 2.7 | 3.2 | 0.6 | 0.6 | 0 | 9.8 | 1600× 4 | nitrogen |
| 23* | None | 0 | 5.7 | 0.6 | 0.6 | 0 | 9.5 | 1700× 4 | nitrogen |
| 24* | None | 0 | 5.7 | 0.6 | 0.6 | 0.6 | 9.5 | 1700× 4 | nitrogen |
| 25* | None | 0 | 5.7 | 0.6 | 0.6 | 0 | 9.5 | 1600× 4 | nitrogen |
| 26* | None | 0 | 5.7 | 0.6 | 0.6 | 0.6 | 9.5 | 1600× 4 | nitrogen |
| 27* | $Sm_2O_3$ | 2.7 | 0 | 0.6 | 0.7 | 0.6 | 4.5 | 1600× 4 | nitrogen |
| 28* | $Sm_2O_3$ | 5.7 | 0 | 0.6 | 0.7 | 0.6 | 9.5 | 1600× 4 | nitrogen |
| 29* | $Sm_2O_3$ $Nd_2O_3$ | 2.7 3.0 | 0 | 0.6 | 0.7 | 0.6 | 9.5 | 1600× 5 | nitrogen |
| 30 | $Sm_2O_3$ | 2.7 | 3.0 | 2.1 | 0.6 | 0 | 2.7 | 1700× 4 | nitrogen |
| 31 | $Sm_2O_3$ | 2.7 | 3.0 | 1.2 | 0.6 | 0 | 4.8 | 1700× 4 | nitrogen |
| 32 | $Sm_2O_3$ | 2.7 | 3.0 | 0.3 | 0.6 | 0 | 19.0 | 1700× 4 | nitrogen |
| 33* | $Sm_2O_3$ | 2.7 | 3.0 | 0.6 | 0.6 | 0 | 9.5 | 1800× 4 | nitrogen |
| 34* | $Sm_2O_3$ | 2.7 | 3.0 | 0.6 | 0.7 | 0 | 9.5 | 1900× 80 | carbon |
| 35* | $Yb_2O_3$ $Nd_2O_3$ | 2.5 3.0 | 0 | 0.6 | 0.7 | 0 | 9.2 | 1700× 4 | nitrogen |
| 36 | $Sm_2O_3$ | 0.03 | 3.2 | 0.35 | 0.6 | 0 | 9.2 | 1700× 4 | nitrogen |
| 37 | $Sm_2O_3$ | 15.0 | 3.2 | 0.35 | 0.6 | 0 | 52.0 | 1700× 4 | nitrogen |
| 38 | $Sm_2O_3$ | 2.7 | 0.03 | 0.35 | 0.6 | 0 | 7.8 | 1700× 4 | nitrogen |
| 39 | $Sm_2O_3$ | 2.7 | 15.0 | 0.35 | 0.6 | 0 | 50.6 | 1700× 4 | nitrogen |
| 40 | $Sm_2O_3$ | 2.7 | 3.2 | 0.03 | 0.6 | 0 | 196.7 | 1700× 4 | nitrogen |
| 41 | $Sm_2O_3$ | 2.7 | 3.2 | 10.5 | 0.6 | 0 | 0.6 | 1700× 4 | nitrogen |

Note: the samples denoted by * in the above table are examples used for comparison. In addition, the content of $CaCO_3$ is calculated in oxide CaO form.

UNITED STATES PATENT AND TRADEMARK OFFICE
CERTIFICATE OF CORRECTION

PATENT NO. : 6,403,510 B1
DATED : June 11, 2002
INVENTOR(S) : Kuibira et al.

It is certified that error appears in the above-identified patent and that said Letters Patent is hereby corrected as shown below:

Columns 12 and 13,
Please replace Table 3 to read:

Table 3

| sample | relative density (%) | heat conductivity (W/mK) | 3-point bending strength average (MPa) | Weibull coefficient | remarks(number of compact bodies with cracks) |
|---|---|---|---|---|---|
| 1 | 99.3 | 187 | 400 | 12 | None (0p/10p) |
| 2 | 99.6 | 196 | 340 | 11 | None (0p/10p) |
| 3 | 99.5 | 185 | 475 | 15 | None (0p/10p) |
| 4 | 99.5 | 167 | 480 | 14 | None (0p/10p) |
| 5* | 97.2 | 150 | 280 | 9 | None (0p/10p) |
| 6 | 99.1 | 183 | 370 | 10 | None (0p/10p) |
| 7 | 99.3 | 181 | 400 | 11 | None (0p/10p) |
| 8 | 99.0 | 179 | 370 | 10 | None (0p/10p) |
| 9 | 99.2 | 177 | 390 | 11 | None (0p/10p) |
| 10 | 99.2 | 178 | 360 | 11 | None (0p/10p) |
| 11 | 99.4 | 176 | 380 | 13 | None (0p/10p) |
| 12 | 97.1 | 175 | 350 | 10 | None (0p/10p) |
| 13 | 97.0 | 173 | 370 | 12 | None (0p/10p) |
| 14 | 97.6 | 172 | 300 | 10 | None (0p/10p) |
| 15 | 97.1 | 170 | 350 | 10 | None (0p/10p) |
| 16 | 98.0 | 168 | 360 | 12 | None (0p/10p) |
| 17 | 97.7 | 169 | 330 | 14 | None (0p/10p) |
| 18 | 99.6 | 166 | 340 | 11 | None (0p/10p) |
| 19 | 98.4 | 167 | 355 | 10 | None (0p/10p) |
| 20* | 95.0 | 121 | 240 | 6 | None (0p/10p) |
| 21* | 96.3 | 126 | 260 | 8 | None (0p/10p) |
| 22* | 97.9 | 131 | 270 | 9 | None (0p/10p) |
| 23* | 85.3 | 57 | 250 | 7 | None (0p/10p) |
| 24* | 88.2 | 68 | 270 | 8 | None (0p/10p) |
| 25* | 82.6 | 70 | 210 | 5 | None (0p/10p) |
| 26* | 90.0 | 60 | 260 | 8 | None (0p/10p) |
| 27* | 90.2 | 101 | 240 | 6 | 2 (2p/10p) |
| 28* | 92.3 | 113 | 260 | 8 | None (0p/10p) |
| 29* | 94.7 | 101 | 277 | 9 | None (0p/10p) |
| 30 | 95.0 | 172 | 300 | 8 | 3 (3p/10p) |
| 31 | 97.0 | 180 | 310 | 9 | 1 (1p/10p) |
| 32 | 95.0 | 167 | 300 | 7 | None (0p/10p) |
| 33* | 99.5 | 184 | 290 | 8 | None (0p/10p) |
| 34* | 99.8 | 189 | 187 | 6 | None (0p/10p) |
| 35* | 99.8 | 160 | 330 | 14 | None (0p/10p) |
| 36 | 92.4 | 167 | 310 | 10 | None (0p/10p) |
| 37 | 99.6 | 168 | 350 | 14 | None (0p/10p) |
| 38 | 90.2 | 166 | 330 | 11 | 1 (1p/10p) |
| 39 | 99.7 | 167 | 330 | 13 | None (0p/10p) |
| 40 | 89.4 | 169 | 310 | 10 | None (0p/10p) |
| 41 | 99.9 | 166 | 320 | 13 | 8 (8p/10p) |

Note: The samples denoted by * in the above table are examples for comparison.

UNITED STATES PATENT AND TRADEMARK OFFICE
CERTIFICATE OF CORRECTION

PATENT NO. : 6,403,510 B1
DATED : June 11, 2002
INVENTOR(S) : Kuibira et al.

It is certified that error appears in the above-identified patent and that said Letters Patent is hereby corrected as shown below:

Column 13,
Line 42, after "in", replace "$R_{23}$" by -- $R_2O_3$ --.
Line 52, after "manufacturing", replace "an" by -- the --.

Signed and Sealed this

Seventh Day of October, 2003

JAMES E. ROGAN
*Director of the United States Patent and Trademark Office*